United States Patent
Hsieh et al.

[11] Patent Number: 5,405,518
[45] Date of Patent: Apr. 11, 1995

[54] WORKPIECE HOLDER APPARATUS

[75] Inventors: Ming-Hsun Hsieh, Taichung; Chung-Shu Chang, Hsinchu, both of Taiwan, Prov. of China

[73] Assignee: Industrial Technology Research Institute, Hsinchu, Taiwan, Prov. of China

[21] Appl. No.: 233,442

[22] Filed: Apr. 26, 1994

[51] Int. Cl.[6] .................................................. C25F 7/00
[52] U.S. Cl. ............................ 204/297 R; 204/297 W
[58] Field of Search .......... 204/297 R, 297 W, 224 M

[56] References Cited

U.S. PATENT DOCUMENTS

| | | | |
|---|---|---|---|
| 3,824,176 | 7/1974 | Crowe | 204/297 R |
| 4,303,482 | 12/1981 | Bühne et al. | 204/129.3 |
| 4,428,815 | 1/1984 | Powell et al. | 204/297 W |
| 5,227,041 | 7/1993 | Brogden et al. | 204/297 W X |
| 5,324,410 | 6/1994 | Kummer et al. | 204/297 R X |

*Primary Examiner*—Donald R. Valentine
*Attorney, Agent, or Firm*—W. Wayne Liauh

[57] ABSTRACT

A high-temperature electrochemical etching apparatus containing a workpiece holder, which contains a first base plate and a second base plate to be joined together by screws, the first base plate having a recess on the front face thereof for receiving and retaining the workpiece, and both the first and second plates having a through hole to receive a contact electrode, which is electrically connected to a conductor wire. The second base plate has a protective wire sleeve fixedly inserted therein to allow the conductor wire to conduct electricity to the workpiece in a protectively sealed manner. A memory alloy coil and a buffer spring are provided between the contact electrode and the conductor wire in such a manner that the contact electrode is in a normally removed position from the workpiece until during high-temperature electrochemical etching operations, at which time, the memory alloy coil will expand thereby allowing electric voltage to be transferred to the workpiece. This feature prevents the workpiece from being cracked, which was often caused due to the unevenness of the workpiece, when the workpiece holder is tightened together. The unintended portions of the workpiece, as well as the rear and side portions thereof, are protected from the highly corrosive etching fluid by first and second O-rings. The first O-ring, which receives a compressional force when the workpiece holder is tightened, does not directly act on the workpiece. Rather, the compressional force acting on the first O-ring is transferred via a slanted surface to a second O-ring, which then acts on the workpiece. Since the force acting on the workpiece is not perpendicular to its surface, the possibility of cracking the workpiece is further minimized.

11 Claims, 3 Drawing Sheets

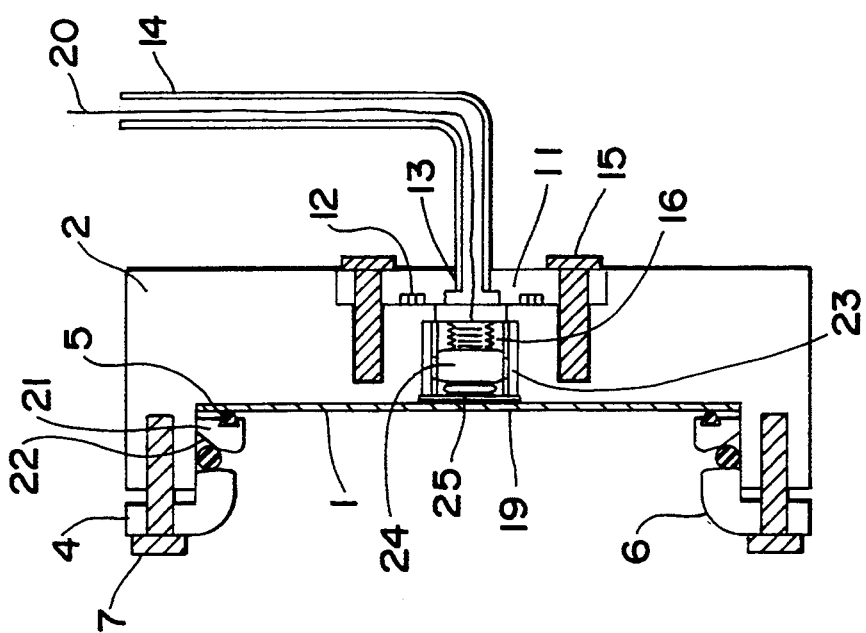
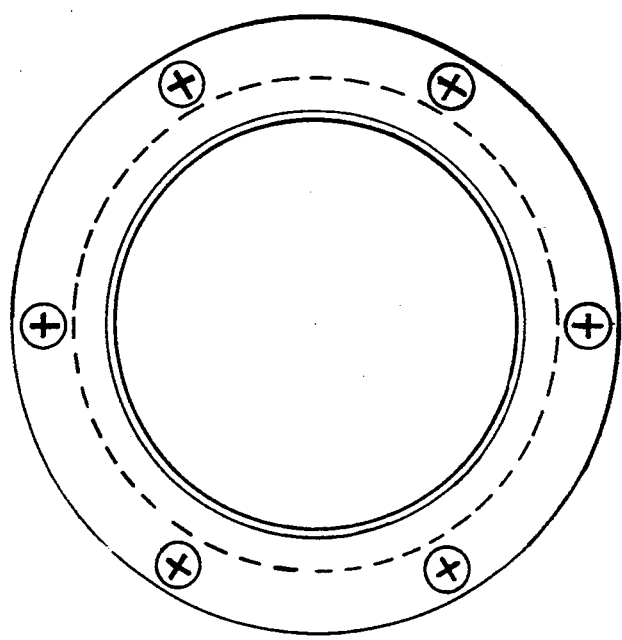

WORKPIECE HOLDER APPARATUS

FIELD OF THE INVENTION

The present invention relates to an apparatus for electrochemically etching a workpiece. More specifically, the present invention relates to a workpiece holder for use in the selective high-temperature electrochemical etching operation of a conductive workpiece, such as a metallic diaphragm or a silicon or semiconductor wafer, while providing a tightly sealed protection against any invasion of the highly corrosive etching fluid onto the unintended portions as well as the rear or side portions of the workpiece being electrochemically etched, thus ensuring a high stability of the electrochemical etching operation.

BACKGROUND OF THE INVENTION

High-temperature electrochemical etching has become a widely used technique for the manufacturing of electronic components using micro-fabrication processes. The electronic components that can be made involving the electrochemical etching process include metal diaphragms for use in sensors, actuators, pressure transducers, etc., and silicon and semiconductor wafers. Because the electrochemical etching process typically involves a very severe environment and requires the workpiece to be placed in long-time exposures to a highly corrosive and strongly acidic or strongly basic etching solution at elevated temperatures, it is necessary to provide a special workpiece holder that will protect the workpiece from the invasion of the etching solution into those portions that are not intended to be etched.

More specifically, because of the extremely harsh environment to which a workpiece is being exposed during the high-temperature electrochemical etching operations, it is desirable to provide a workpiece holder that will allow the etching solution to contact only the intended portions of the workpiece (i.e., those portions that are intended to be etched), and will protect the rear and side portions of the workpiece from any possible contact with the highly corrosive etching solution. Also, because an electric current is required during the electrochemical etching operation, the workpiece holder must provide a protectively sealed environment for an electric conductor wire to go into the workpiece holder and conduct electricity to the workpiece. Furthermore, it also desirable to provide a workpiece holder that can be easily and safely assembled/disassembled and facilitate a satisfactory control of the electrochemical etching operation, even in light of the harsh and difficult conditions under which it is expected to work.

A typical workpiece holder for electrochemical etching operations is shown in FIG. 1. Several problems have been encountered, most notably in that it does not completely prevent the rear and side portion from invasion by the etching fluid. This problem becomes more ostensible during high-temperature electrochemical etching operations. Furthermore, the conventional workpiece holders use a metal plate as the contact electrode to conduct electricity between a conductor wire and the workpiece. If the metal plate contains an unacceptable unevenness on their surface, such unevenness could cause the workpiece to crack when it is urged during the assembly of the etching apparatus. Although it has been proposed to use eutectic In-Ga alloy as the contact electrode to solve the cracking problem, which is caused by the uneven metal surface, and to improve the stability of the contact between the electrode and the workpiece, this is not a very practical approach. One of the problems associated with using the In-Ga alloy as the contact electrode is that, because of it is a liquid phase, it is very difficult to place the contact electrode in a vertical position, thus making the etching process very cumbersome.

One method to solve the leaking problem experienced with conventional workpiece holders is to place two substantially concentric O-rings on the base of the workpiece holder, and introduce nitrogen gas into the space between the two O-rings. This method was taught in *Sensors and Actuators* A29, pp 209–215 (1991). The nitrogen pressure between the two O-rings prevents the penetration of the etching solution. In electrochemical etching operations, however, because it is necessary to provide an external wire to conduct electric current to the workpiece, this method, which utilizes sealed pressure to prevent leaking, is impractical. Furthermore, this method does not protect the side portions of the workpiece during electrochemical etching operations.

U.S. Pat. No. 4,303,408 teaches an apparatus for selective electrochemical etching. The advantage of this apparatus is that it does not require a conventional workpiece holder and it only allows the area to be etched to be exposed to the etching solution; therefore, it can easily solve the problems associated with the placement of the conductor wire. However, because the apparatus disclosed in the '408 patent involves an open environment, it is difficult to operate at elevated temperatures. Furthermore, the selective electrochemical etching apparatus disclosed in the '408 patent has only limited applications, and is not suitable for large scale productions.

SUMMARY OF THE INVENTION

Having discussed the problems experienced with the conventional electrochemical etching apparatuses, mainly their inability to completely protect the rear and/or side portions of the workpiece from the highly corrosive etching solution, the problems associated with the placement of a conductor wire to conduct electricity to the workpiece, and the inadequacy of attempted improvements to solve these problems, the primary object of the present invention is to provide a tooling apparatus that provides high stability during high-temperature electrochemical etching operations.

More specifically, the primary object of the present invention is to provide a workpiece holder for use during high-temperature electrochemical etching operations that will completely shield the unintended portions, as well as the rear and the side portions, of the workpiece from invasion by the highly corrosive etching fluid. The present invention also allows the workpiece holder to be easily, conveniently and safely assembled/disassembled before and after electrochemical etching operations. Furthermore, the workpiece holder of the present invention provides excellent protections to seal off any possible leakage problems that may be associated with the placement of the conductor wire and the contact electrode. Another advantage of the apparatus disclosed in the present invention is that it avoids the cracking problems experienced in the prior art methods when the workpiece is pressed against the contact electrode during the assembly of the workpiece holder to hold the workpiece in a fixed position.

The present invention, in accordance with a first preferred embodiment, discloses an apparatus for electrochemical etching operations containing a workpiece holder, the workpiece holder comprises:

(a) a first base plate, which has a upper portion and a lower portion, the upper portion is provided with a recess on the front face thereof for receiving and retaining the workpiece in place, a first through hole penetrating the upper portion and the lower portion of the first base plate to provide a sealed environment for the placement of the contact electrode and a conductor wire, and a plurality of first threaded holes;

(b) a second base plate and a protective wire sleeve to allow a conductor wire to conduct electricity to the workpiece in a protectively sealed manner, the second base plate is to be fixedly attached to the rear face of the first base plate, the second base plate has a second through hole disposed in a corresponding relationship with the first through hole for allowing the protective wire sleeve to be inserted thereinto, and a plurality of second threaded holes in respectively corresponding relationships with the first threaded holes in the first base plate;

(c) a contact electrode disposed in the first through hole to allow electricity to be conducted to the workpiece during the electrochemical etching operations; the contact electrode, which is in a normally spaced apart relationship with the workpiece, is connected to a conductor wire via a buffer coil and a memory alloy coil; wherein when the memory alloy coil expands at elevated temperatures, the contact electrode will be urged against the workpiece to conduct electricity thereto; the memory alloy coil will retreat to its original shortened position after the completion of the electrochemical etching operation and temperature is cooled down to a lower temperature, and thus return the contact electrode to its originally spaced apart relationship with the workpiece;

(d) a ring-shaped flange for receiving a ring-shaped outer portion of the front portion of the first base plate; the ring-shaped flange comprises an upper flange member and a lower flange member to be removably joined by a threadably means; the upper flange member has an O-ring groove for receiving a first O-ring; and (e) the lower portion of the ring-shaped outer portion of the first base plate has a slanted surface which forms a space with the ring-shaped flange for receiving a second O-ring.

In the apparatus disclosed in the present invention, the slanted surface in the upper portion of the first base plate causes the first O-ring to be deformed when the threadable means connecting the upper flange and the lower flange together is tightened. This forces the first O-ring to be pressed tightly against the slanted surface and the flange thus providing a tight seal protecting the rear and side portions of the workpiece from invasion by the strongly corrosive etching fluid during the high-temperature electrochemical etching operations. Such a sealing means prevents the corrosive etching fluid from entering through the rear portion of the workpiece holder. The slanted surface in the upper portion of the first base plate also allows the tightening force, which is perpendicular (vertical) to the surface of the workpiece, to generate a component parallel (horizontal) to the surface of the workpiece. The horizontal force will be effectively transmitted to the second O-ring causing the second O-ring to be deformed to provide a tight seal against the invasion of the etching fluid into the unintended portions of the workpiece without directly urging on the workpiece. The slanted surface thus allows the possibility of cracking the workpiece to be minimized.

With conventional workpiece holders, the second O-ring is pressed directly against the workpiece when a tightening force is applied. Since the workpiece in a conventional workpiece holder is sandwiched between the second O-ring and an electrode plate, any unevenness on the surface of the workpiece will likely cause the workpiece to crack, when a force is acted thereon. The present invention minimizes the amount of the vertical force that is directly urged on the workpiece; therefore, the workpiece will not crack even though it may contain unevenness. Furthermore, the present invention uses a memory spring to replace the conventional electrode plate; therefore, there is no direct contact between the workpiece and the spring electrode when the workpiece holder is put together. This minimizes the possibility of cracking the workpiece to essentially zero.

The apparatus disclosed in the present invention also provides substantial improvement regarding the required placement of the conductor wire and the contact electrode plate in a well protected environment. With the present invention, the contact electrode plate will be automatically brought in contact with the workpiece only during the high-temperature electrochemical etching operations, as a result of the thermal expansion of the memory alloy coil. During the assembly of the workpiece holder to be ready for the electrochemical etching operation, the contact electrode is removed from the workpiece. This novel feature of the present invention not only allows the conductor wire and the contact electrode to be safely and conveniently placed in a tightly sealed position, it also contributes to the prevention of the cracking of the workpiece during the tightening of the workpiece holder.

BRIEF DESCRIPTION OF THE DRAWING

The present invention will be described in detail with reference to the drawing showing the preferred embodiment of the present invention, wherein:

FIG. 3 is a side cross-sectional view of the workpiece holder for use in high-temperature electrochemical etching operations according to the second embodiment of the present invention.

FIG. 4 is a top view of the workpiece holder for use in high-temperature electrochemical etching operations according to the second embodiment of the present invention as shown in FIG. 3.

DETAILED DESCRIPTION OF THE PREFERRED EMBODIMENT

Figure 1:
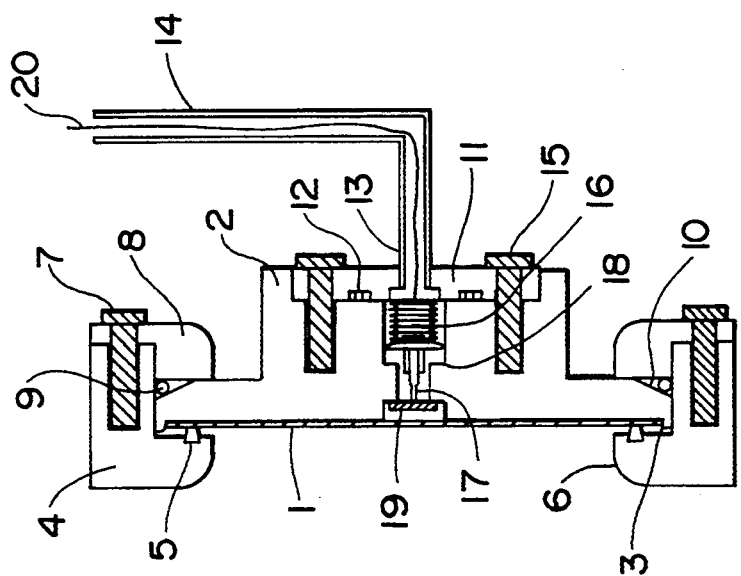
FIG. 1 is a side cross-sectional view of the workpiece holder for use in high-temperature electrochemical etching operations according to the first embodiment of the present invention.
Figure 2:
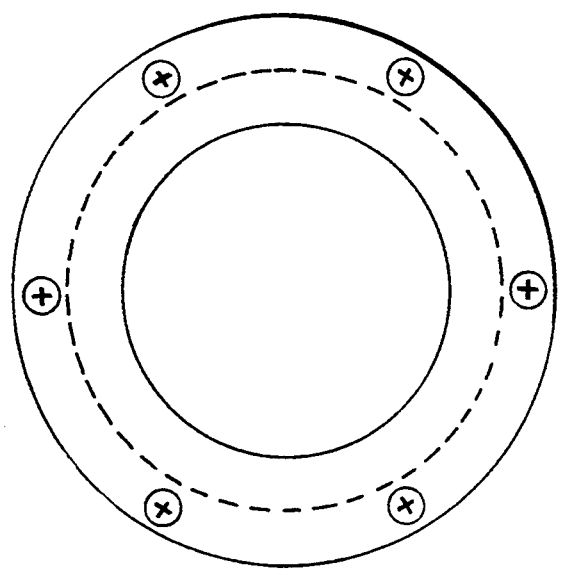
FIG. 2 is a top view of the workpiece holder for use in high-temperature electrochemical etching operations according to the first embodiment of the present invention as shown in FIG. 1.
Figure 5:
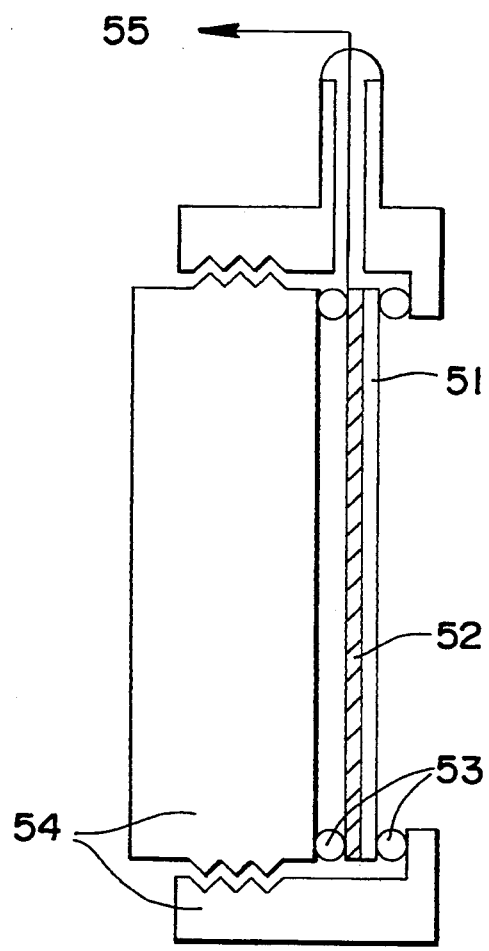
FIG. 5 is a side cross-sectional view of a conventional workpiece holder for use in electrochemical etching operations.

Now referring to the drawings, FIGS. 1 and 2 show the side cross-sectional view and top view, respectively, of the workpiece holder for use in high-temperature electrochemical etching operations according to the first embodiment of the present invention. FIGS. 3 and 4 show the side cross-sectional view and top view, respectively, of the workpiece holder for use in high-temperature electrochemical etching operations according to the second embodiment of the present invention. FIG. 5 is a side cross-sectional view of a conventional workpiece holder for use in electrochemical etching operations.

In FIG. 5, it is shown a Teflon holder 54, a workpiece to be electrochemically etched 51, a contact electrode 52, and a conductor wire 55. A pair of O-rings are provided to seal off unintended portions of the workpiece 51 from invasion by the etching solution, when the Teflon holder 54 is urged together by a threadable means. The conventional workpiece holders exhibit several disadvantages when used in high-temperature electrochemical etching operations. Most notably, the hot corrosive etching solution may permeate through the threads of the Teflon holder 54 and contact the rear and especially the side portions of the workpiece 5 1. Furthermore, because the urging force applied to the Teflon holder 54, which is necessary in order to provide the required sealing protection, acts directly on the workpiece 51 (i.e., the urging force is perpendicular to the surface of the workpiece), this often causes the workpiece 51 to crack, if there is any unevenness in the workpiece, resulting in interruption of the etching operations and material loss.

The present invention will now be described more specifically with reference to the following examples. It is to be noted that the following descriptions of example including preferred embodiment of this invention are presented herein for purpose of illustration and description; it is not intended to be exhaustive or to limit the invention to the precise form disclosed.

First Preferred Embodiment:

In FIGS. 1 and 2, which describe the various parts of the workpiece holder according to the first preferred embodiment of the present invention, it is shown a workpiece 1, which is to be electrochemically etched, placed between a first support plate 2 and a ring-shaped flange assembly 4 and 8. The workpiece I sits within the recess 3 on the front face of the first support plate 2. The ting-shaped flange assembly 4 and 8 comprises an upper flange member 4 and a lower flange member 8 fastened together by a plurality of screws 7. An O-ring is provided between the workpiece 1 and the upper flange member 4 to seal off the unintended portion of the workpiece from invasion by the etching fluid. The first support plate 2 contains a ring-shaped slanted outer surface 10, which allows a space to be formed with the flange assembly 4 and 8. Another O-ring 9 is placed in the space formed between the slanted surface 10 and the flange assembly 4 and 8.

When the lower flange member 8 is urged against the upper flange member 4 by the screws 7, O-ring 9 is deformed to provide a protective sealing against the invasion of etching fluid into the rear and side portions of the workpiece 1. The slanted surface 10 also allows the urging force to be transferred at an inclined angle relative to the urging direction thus effectively and indirectly causing O-ring 5 to be deformed and provide an effective seal. By applying an indirect force on the workpiece 1, it prevents the cracking problems experienced in the prior art. In a further preferred embodiment, the upper flange member 4 is provided with an arcuate ring-shaped peripheral surface 6 to allow for easy exit of gases which may be produced during the electrochemical etching operations.

Another important novel feature of the present invention as illustrated in FIG. 1 is that the contact electrode 19 does not contact the workpiece 1, when the workpiece holder is initially assembled. This provision prevents the workpiece 1 from having to be pressed against a hard contact electrode 19, thus it further avoids the cracking problems experienced in the prior art. The contact electrode 19 is connected to a memory alloy coil 16 via a probe-type buffer spring 17. The memory alloy coil 16 is connected to a conductor wire 20 to conduct electricity to the contact electrode 19. The contact electrode 19, memory alloy coil 16, and the buffer spring 17 are shielded from the etching solution by a second support plate 11, which is fastened to the first support plate 2 by a plurality of screws 15, and an O-ring 12.

The conductor wire 20 is protected from being contacted by the etching fluid by a protective sleeve 14, which is welded to the second support plate 11 at welding point 13. At elevated temperatures, the memory alloy coil 16 expands thus causing the contact electrode 19 to be in contact with the workpiece 1. The extent of the expansion is controlled by the buffer spring 17 to provide a safe and reliable contact between the contact electrode 19 and the workpiece 1 to ensure a desired amount of voltage to be supplied to the workpiece 1. After the electrochemical etching operation is completed and the temperature of the workpiece is lowered, the contact electrode 19 will be removed from the workpiece, thus cutting off electricity to the workpiece 1. This facilitates a safe and easy removal and disassembly of the workpiece 1 from the workpiece holder.

Second Preferred Embodiment:

FIGS. 3 and 4 describe the second preferred embodiment of the present invention. In FIGS. 3 and 4, it is shown a workpiece 1 placed between a first support plate 2 and a ring-shaped upper flange member 4. The workpiece 1 sits inside the inner front face of the first support plate 2. The ring-shaped upper flange member 4 is fastened directly to the first support plate 2 by a plurality of screws 7. A ring-shaped stopper 21 is placed between the upper flange member 4 and the workpiece 1. The ring-shaped stopper 21 is provided with an O-ring groove on the bottom surface thereof to receive an O-ring 5, which is placed between the workpiece 1 and the ring-shaped stopper 21 to seal off the unintended portion of the workpiece from invasion by the etching fluid. The ring-shaped stopper 2 1 also contains a ring-shaped slanted outer surface 22 on it upper surface.

The slanted surface 22 allows a space to be formed among the upper flange member 4, the first support plate 2 and the slanted surface 22 to receive O-ring 9. When the upper flange member 4 is tightened against the first support plate 2 by the screws 7, O-ring 9 is deformed to provide a protective sealing against the invasion of etching fluid into the rear and side portions of the workpiece 1. The slanted surface 22 also allows the urging force to be transferred at an inclined angle relative to the urging direction thus effectively and indirectly causing O-ring 5 to be deformed and provide an effective seal.

By applying an indirect force on the workpiece 1, the slanted surface of the present invention also prevents the cracking problems experienced in the prior art. The upper flange member 4 can also be provided with an arcuate ring-shaped peripheral surface 6 to allow for the easy exit of gases that may be produced during the electrochemical etching operations.

The second preferred embodiment as shown in FIG. 3 also provides several novel features regarding the placement of the contact electrode 19. Similar to the first preferred embodiment, the contact electrode 19 also does not contact the workpiece 1, when the workpiece holder is initially assembled. The contact electrode 19 is connected to a memory alloy coil 16 via a spring-type buffer spring 25 and a central conductor shaft 24. A plurality of spindle supports 23 are provided to support the various components. The memory alloy coil 16 is connected to a conductor wire 20 to allow the electricity to be conducted to the contact electrode 19. The contact electrode 19, memory alloy coil 16, the central conductor shaft 24, the support spindles 23, and the buffer spring 17 are all shielded from the highly corrosive etching fluid by a second support plate 11, which is fastened to the first support plate 2 by a plurality of screws 15, and an O-ring 12.

The conductor wire 20 is further protected by a protective sleeve 14, which is welded to the second support plate 11 at welding point 13. Similar to the first preferred embodiment, the memory alloy coil 16 expands at elevated temperatures thus causing the contact electrode 19 to be in contact with the workpiece 1. The extent of the expansion is controlled by the buffer spring 17. After the electrochemical etching operation is completed, the temperature of the workpiece is lowered, and the contact electrode 19 is removed from the workpiece, thus cutting off electricity to the workpiece 1. This facilitates an easy removal and assembly of the workpiece 1 into the workpiece holder.

Third Preferred Embodiment:

The third preferred embodiment is a hybrid between the first and second preferred embodiments. The basic construction is identical to the second preferred embodiment as shown in FIG. 3, except that its electrode is replaced with the memory alloy coil-probe-type buffer spring electrode of the first preferred embodiment as shown in FIG. 1.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. an apparatus for high-temperature electrochemical etching operations containing a workpiece holder to be immersed in an etching fluid, said workpiece holder comprising:

(a) a first base plate having a upper portion and a lower portion, said upper portion having a recess for receiving said workpiece whose front surface is to be electrochemically etched, a first through hole formed through said upper and lower portions;

(b) a second base plate and a protective wire sleeve to allow a conductor wire to conduct electricity to the workpiece in a protectively sealed manner, said second base plate being fixedly attached to said lower portion of said first base plate, said second base plate has a second through hole disposed corresponding to said first through hole to allow said protective wire sleeve to be inserted thereinto;

(c) a contact electrode and an expandable conductor means in said first through hole which are electrically connected to said conductor wire, said expandable conductor means being provided in such a manner so that said contact electrode is in a normally spaced apart relationship with regard to said workpiece, said expandable conductor means further being adapted to expand at elevated temperatures so as to cause said contact electrode to be urged against the workpiece to allow electricity to be conducted thereto from said conductor wire during said electrochemical etching operations; and (d) a ring-shaped flange means in cooperation with first and second O-ring type sealing means and a slanted force transfer means to seal portions of said workpiece that are not intended to be etched from invasion by said etching fluid, said slanted force transfer means being adapted to allow part of an urging force acted on said first O-ring type sealing means to be transferred to act on said second O-ring type sealing means at an inclined angle relative to said front surface of said workpiece.

2. The workpiece holder for use with a high-temperature electrochemical etching apparatus according to claim 1 wherein said first support plate and said second support plate are fastened by a plurality of screw means.

3. The workpiece holder for use with a high-temperature electrochemical etching apparatus according to claim 1 wherein said protective wire sleeve are affixed to said second support plate in a sealed manner by a welding means.

4. The workpiece holder for use with a high-temperature electrochemical etching apparatus according to claim 1 wherein said expandable conductor means comprises a memory alloy coil and a buffer spring connected in series, said memory alloy coil being connected to said conductor wire and said buffer spring being connected to said contact electrode.

5. The workpiece holder for use with a high-temperature electrochemical etching apparatus according to claim 1 wherein said expandable conductor means comprises a memory alloy coil, a central conductor shaft and a buffer spring connected in series, said memory alloy coil being connected to said conductor wire and said buffer spring being connected to said contact electrode, said expandable conductor means being supported by a plurality of spindles surrounding thereabout.

6. The workpiece holder for use with a high-temperature electrochemical etching apparatus according to claim 1 wherein said upper portion of said first support plate contains a ring-shaped extension and said flange means comprises an upper flange member and a lower flange member to be fastened together by a threadable means to receive a portion of said ring-shaped extension of said first support plate therebetween.

7. The workpiece holder for use with a high-temperature electrochemical etching apparatus according to claim 6 wherein:
    (a) said first and second O-ring type sealing means are disposed on opposite sides of said ring-shaped extension of said first support plate, with said first O-ring type sealing means disposed between said lower flange member and said lower portion of said first support plate and said second O-ring type sealing means disposed between said upper flange member and said upper portion of said first support plate, and said first O-ring type sealing means also being disposed radially outwardly of said second O-ring type sealing means;
    (b) said slanted force transfer means comprises a slanted surface on a lower outer portion of said ring-shaped extension of said first support plate, said slanted surface forming a space with said upper and lower flange members to receive said first O-ring type sealing means;
    (c) wherein said slanted surface causing said urging force acting on said first O-ring type sealing means as a result of a fastening action of said lower flange member against said upper flange member to be transferred at an inclined angle relative to said urging force to said second O-ring type sealing means.

8. The workpiece holder for use with a high-temperature electrochemical etching apparatus according to claim 6 wherein said upper flange member further comprising an arcuate upper inner surface to faciliate an easy exit of gases that may be produced during said electrochemical etching operations.

9. The workpiece holder for use with a high-temperature electrochemical etching apparatus according to claim 1 wherein said flange means comprising an upper flange member to be fastened to said first support plate by a threadable means.

10. The workpiece holder for use with a high-temperature electrochemical etching apparatus according to claim 9 wherein:
    (a) said slanted force transfer means comprising a ring-shaped stopper having a slanted surface on an upper outer portion thereof, said ring-shaped stopper being disposed inside said recess inside said upper portion of said first support plate, and between said upper flange member and said workpiece;
    (b) said first and second O-ring type sealing means being disposed on opposite sides of said ring-shaped stopper, said first O-ring type sealing means being disposed between said slanted surface of said ring-shaped stopper and said upper flange member, said ring-shaped stopper having a substantially fiat surface on an lower portion thereof with an O-ring groove provided thereon to receive said second O-ring type sealing means, said first O-ring type sealing means also being disposed radially outwardly of said second O-ring type sealing means;
    (c) wherein said slanted surface causing said urging force acting on said first O-ring type sealing means by a fastening action between said upper flange member and said first support plate to be transferred at an inclined angle relative to said urging force to said second O-ring type sealing means.

11. The workpiece holder for use with a high-temperature electrochemical etching apparatus according to claim 9 wherein said upper flange member further comprising an arcuate upper inner surface to faciliate an easy exit of gases that may be produced during said electrochemical etching operations.

* * * * *